(12) United States Patent
Park et al.

(10) Patent No.: US 7,068,058 B2
(45) Date of Patent: Jun. 27, 2006

(54) SEMICONDUCTOR INTEGRATED CIRCUIT DEVICE WITH TEST ELEMENT GROUP CIRCUIT

(75) Inventors: Chul-Sung Park, Seoul (KR); Yong-Hwan Noh, Suwon-shi (KR); Byong-Kwon Lee, Suwon-shi (KR); Hyang-Ja Yang, Suwon-shi (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/976,491

(22) Filed: Oct. 30, 2004

(65) Prior Publication Data

US 2005/0056834 A1 Mar. 17, 2005

Related U.S. Application Data

(63) Continuation of application No. 10/346,019, filed on Jan. 16, 2006, now Pat. No. 6,822,330.

(30) Foreign Application Priority Data

May 22, 2002 (KR) ................................ 2002-28479

(51) Int. Cl.
*G01R 31/26* (2006.01)

(52) U.S. Cl. ...................... 324/763; 324/765; 257/508; 257/758

(58) Field of Classification Search ........ 324/763–769, 324/158.1; 257/508, 758, 760, 776
See application file for complete search history.

(56) References Cited

U.S. PATENT DOCUMENTS

| 4,888,631 | A | * | 12/1989 | Azuma et al. | ................. | 257/66 |
| 5,949,090 | A | * | 9/1999 | Iwasa et al. | ................. | 257/48 |
| 6,177,733 | B1 | * | 1/2001 | Obara | ........................ | 257/786 |
| 6,423,558 | B1 | * | 7/2002 | Maeda et al. | ................. | 438/17 |
| 6,822,330 | B1 | * | 11/2004 | Park et al. | ................... | 257/758 |

* cited by examiner

*Primary Examiner*—Minh N. Tang
(74) *Attorney, Agent, or Firm*—F. Chau & Associates LLC

(57) ABSTRACT

Disclosed is a semiconductor integrated circuit device which includes a test element group circuit connected between a first and a second pad. The test element group circuit includes a plurality of semiconductor devices connected in series between the first and second pads. At least two adjacent ones of the semiconductor devices are connected to each other via a signal path that is formed by a multi-layer interconnection structure.

2 Claims, 7 Drawing Sheets

SEMICONDUCTOR INTEGRATED CIRCUIT DEVICE WITH TEST ELEMENT GROUP CIRCUIT

CROSS-REFERENCE TO RELATED APPLICATION

This application is a Continuation to U.S. Pat. No. 6,822,330 (Ser. No.: 10/346,019 filed Jan. 16, 2003) the disclosure of which is incorporated herein by reference in its entirety.

BACKGROUND

1. Field of the Invention

The present invention is related to semiconductor integrated circuit devices, and, in particular, to a semiconductor integrated circuit device that includes a test element group circuit.

2. Discussion of Related Art

In general, a plurality of integrated circuit chips are formed on a pure semiconductor substrate, so-called a wafer, by performing well-known semiconductor processes, each of which has its specific property. After fabrication processes are completed, the wafer is broken up into individual integrated circuit chips. An empty space is provided between integrated circuit chips to separate adjacent integrated circuit chips, and such an empty space is called a scribe line region or a scribe lane region. Elements of an integrated circuit chip are not formed on this scribe line region.

To check the electrical properties of various elements of an integrated circuit chip, a pattern of measuring elements or test elements is formed on a scribe line region of the semiconductor wafer. The pattern of measuring elements or test elements is called a test element group circuit. The test element group circuit is electrically tested to determine whether elements in an integrated circuit chip are properly formed. Semiconductor devices including measuring or test elements are disclosed in U.S. Pat. No. 6,177,733 entitled "SEMICONDUCTOR DEVICE," U.S. Pat. No. 5,949,090 entitled "MOS TEG STRUCTURE," and U.S. Pat. No. 5,654,582 entitled "CIRCUIT WAFER AND TEG PAD ELECTRODE."

A test element group circuit is formed using the same processes as those for forming elements in an integrated circuit chip. Therefore, electrical properties of the test element group circuit are the same as that of elements in the integrated circuit chip. And, electrical properties of the elements of the IC chip can be measured by measuring that element group circuit. However, as the number of dies per wafer is increasingly reduced, it is considerably hard to exactly analyze properties of integrated circuit chips through testing of the test element group circuit. For this reason, a method of analyzing properties of integrated circuit chips has been developed by forming a test element group circuit in an integrated circuit chip, instead of forming it at a scribe line region.

One example of a test element group circuit formed in a chip is disclosed in Japanese Patent Laid-open No. 05-021554 entitled "SEMICONDUCTOR INTEGRATED CIRCUIT" filed on Nov. 7, 1991. The patent describes a technique that prevents defective products from being delivered to consumers by measuring AC properties via an inverter chain formed in a chip.

An integrated circuit device that includes a test element group circuit for measuring AC properties is illustrated in FIG. 1. Referring to FIG. 1, a semiconductor integrated circuit device 1 has a test element group circuit 14 that is connected between pads 10 and 12. The test element group circuit 14 includes a plurality of inverters 16–22 connected in series between the pads 10 and 12.

In operation, probe pins or needles are connected to the pads 10 and 12 in a wafer-level test mode, respectively. A signal applied to the pad 10 is outputted to the pad 12 via the test element group circuit 14. AC properties of the test element group circuit 14 are analyzed by parsing the signal outputted from the pad 12.

FIG. 2 is a top view of a test element group circuit shown in FIG. 1. Referring to FIG. 2, a reference numeral 30 indicates an N-well region formed in a semiconductor substrate (not shown), and a reference numeral 32 indicates an active region defined by device isolation. A reference numeral 34 indicates a polysilicon gate. In FIG. 2, a PMOS transistor of the respective inverters 16–22 is formed on the N-well region 30, and an NMOS transistor of the respective inverters 16–22 is formed on the semiconductor substrate.

Device isolation 38 provides an isolation layer.

FIG. 3 is a cross-sectional view of a test element group circuit taken along a dotted line A–A' of FIG. 2. Referring to FIG. 3, a drain 36 of a PMOS transistor of an inverter 16 is connected via a contact structure 40 to an interconnection M0, which is electrically connected to a gate 34 of a PMOS transistor of an inverter 18 via a contact structure 42. The interconnection may be formed of one of tungsten and polysilicon. Although not shown in figures, a drain of an NMOS transistor of the inverter 16 may be connected to a gate of an NMOS transistor of the inverter 18, by the same manner as illustrated in FIG. 3. It is to be understood that the remaining inverters are connected by the same manner as described above. Here, the contact structures 40 and 42 are called local interconnections, respectively.

As shown in FIGS. 1–3, the inverters 16–22 that form a test element group circuit 14 for measuring AC properties are connected to each other via corresponding interconnections (or, signal paths each formed to have contact structures 40 and 42 and an interconnection M0), which are formed with tungsten or polysilicon. In the case of the test element group circuit 14 having such a signal path structure, AC properties are tested by considering electric properties of MOS transistors such as drain current, threshold voltage, and so forth.

SUMMARY OF THE INVENTION

The present invention is directed to a semiconductor integrated circuit device with a test element group circuit that is capable of measuring process properties and electric properties of the semiconductor integrated circuit device.

According an embodiment of the present invention, a semiconductor integrated circuit device having an internal circuit for performing a function comprises a first pad and a second pad, and a test element group circuit connected between the first pad and the second pad, wherein the test element group circuit includes a plurality of semiconductor devices connected between the first pad and the second pad, and at least two of the semiconductor devices are electrically connected to each other via a signal path formed by a multi-layer interconnection structure.

For example, if the semiconductor integrated circuit device has a three-layer interconnection structure, the signal path is formed to comprise all three interconnections. It is possible to test AC properties of the semiconductor integrated circuit device considering all process properties, by connecting semiconductor elements of the test element group circuit using a signal path of a multi-layer interconnection structure.

According to an embodiment of the present invention, a semiconductor integrated circuit device comprises a first and a second bonding pads connected to corresponding internal circuits, respectively, and a test element group circuit connected between the first bonding pad and the second bonding pad, wherein the test element group circuit includes a plurality of semiconductor devices connected in series between the first bonding pad and the second bonding pad, and wherein adjacent ones of the semiconductor devices are electrically connected to each other via corresponding signal paths, each of which is formed to have a multi-layer interconnection structure.

According to another embodiment of the present invention, a test element group circuit comprises a first inverter including an input terminal connected to a first pad and an output terminal, a second inverter having an input and an output connected to a second pad, and a signal path formed between the output terminal of the first inverter and the input terminal of the second inverter, the signal path being formed to have a multi-layer interconnection structure.

With the above preferred embodiments, electric and process properties can be measured through the test element group circuit according to the present invention.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with accompanying drawings in which like reference symbols indicate the same or similar components, wherein.

DESCRIPTION OF PREFERRED EMBODIMENTS

Preferred embodiments of the invention will be now described with reference to the attached drawings.

Figure 1:
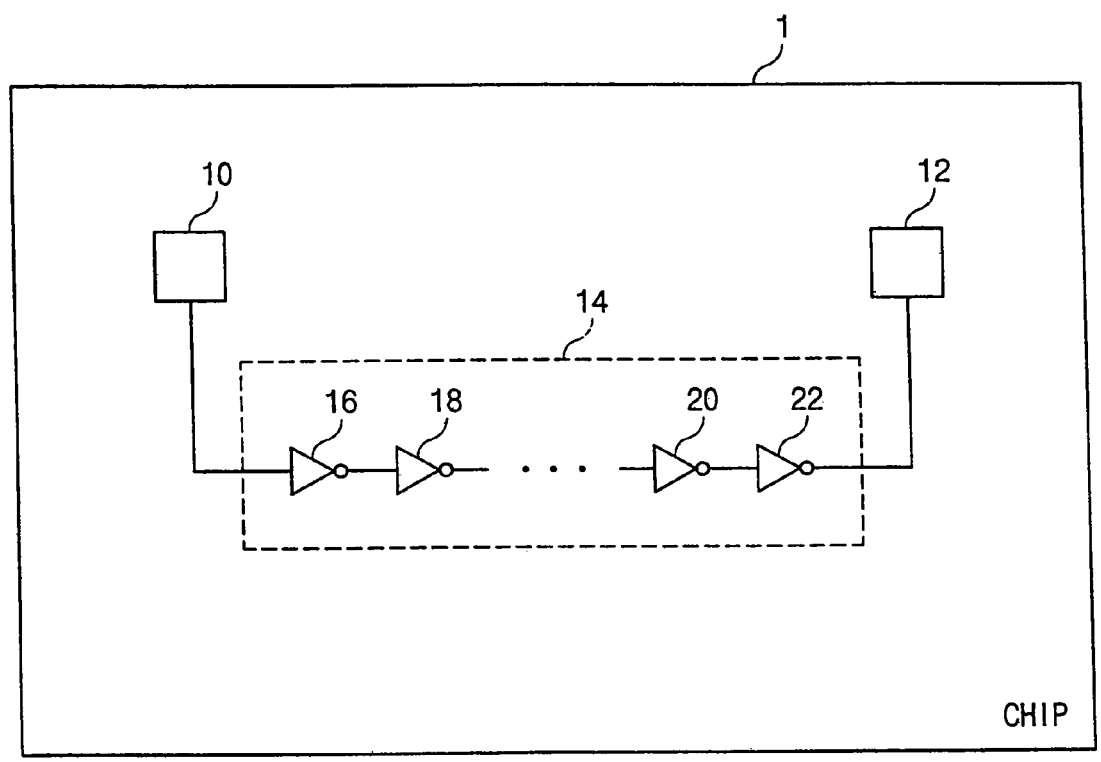
FIG. 1 is a circuit diagram of a semiconductor integrated circuit device including a conventional test element group circuit.
Figure 2:
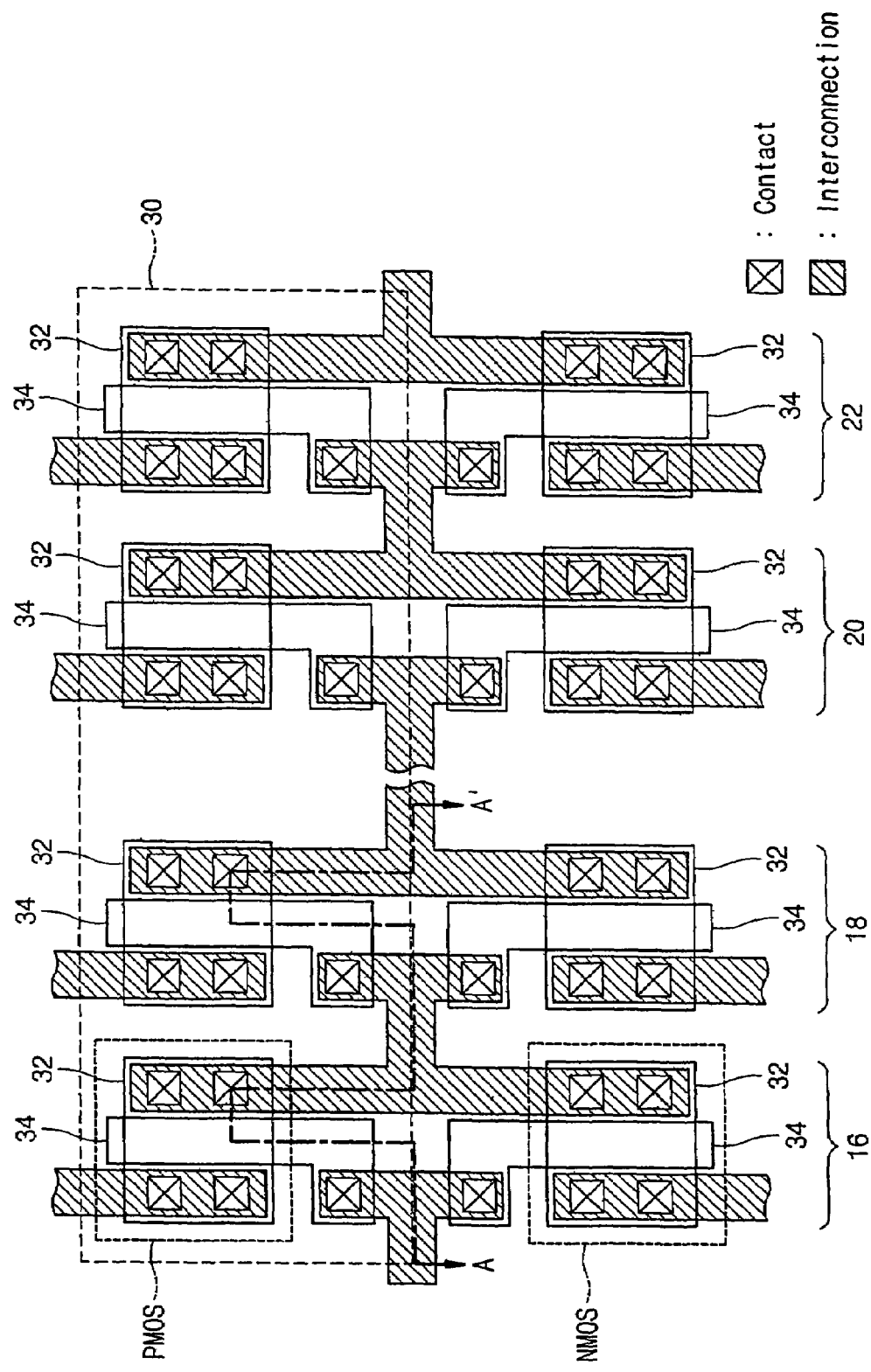
FIG. 2 is a top view of a test element group circuit in FIG. 1.
Figure 3:
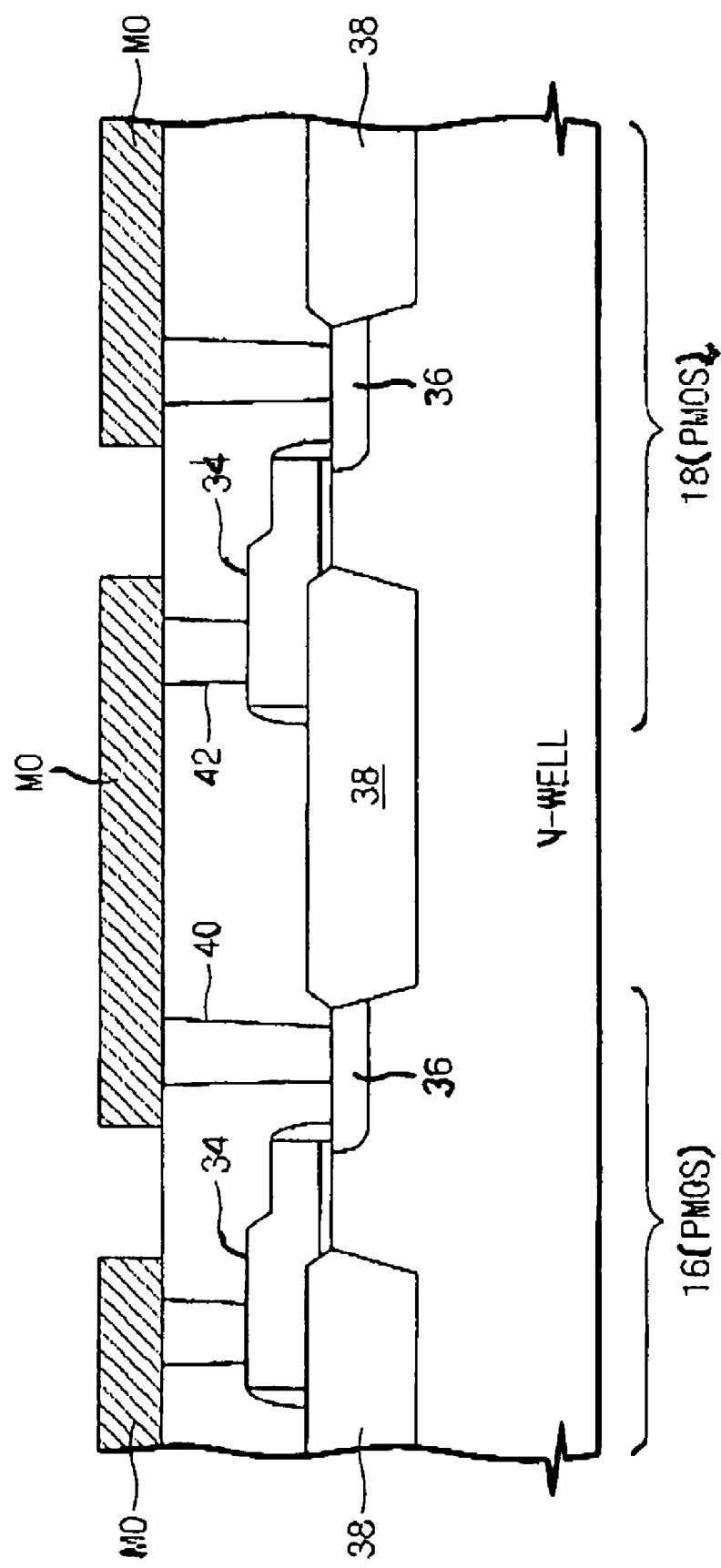
FIG. 3 is a cross-sectional view taken along a dotted line A–A' in FIG. 2.
Figure 4:
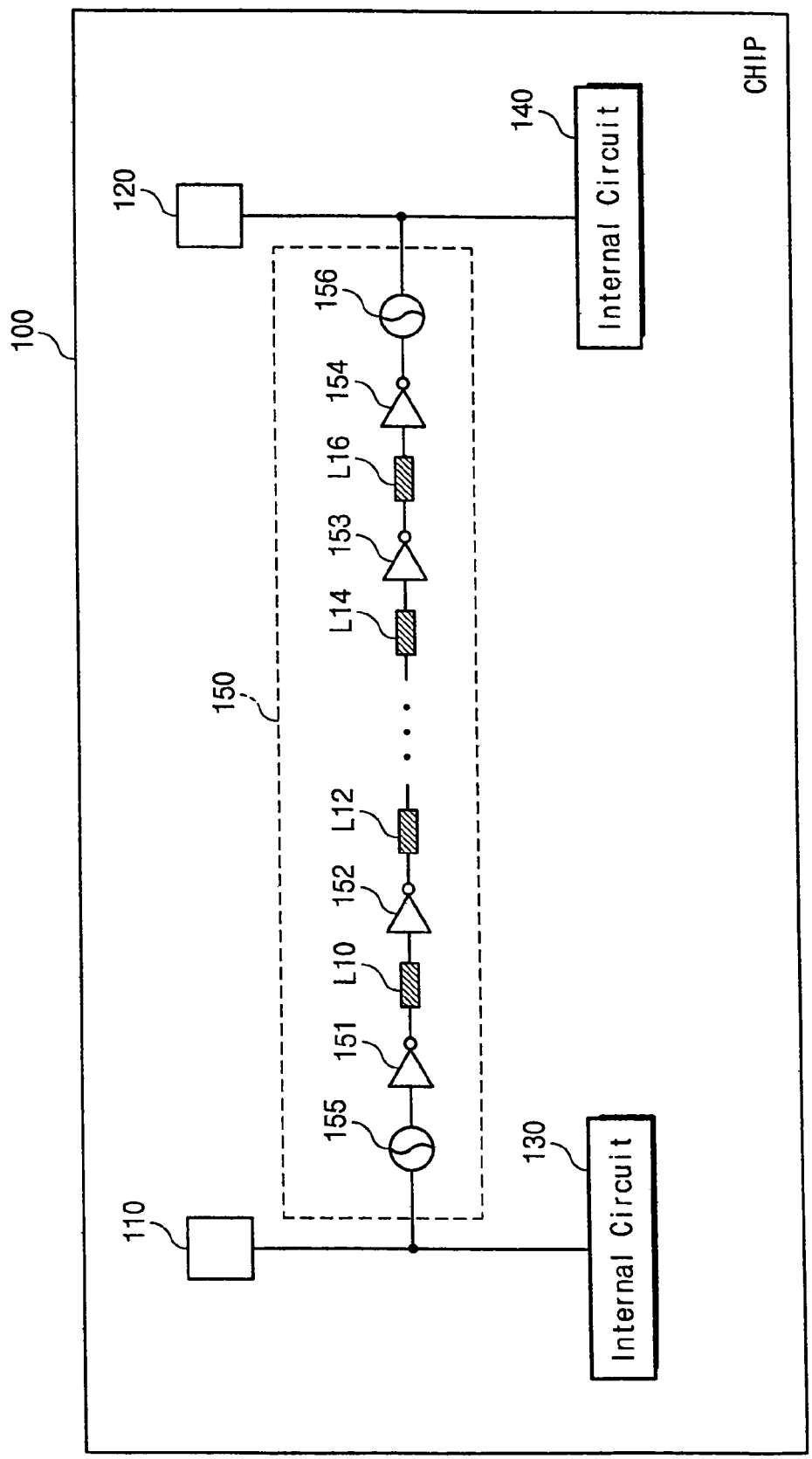
FIG. 4 is a preferred embodiment of a semiconductor integrated circuit device according to the present invention.

FIG. 4 shows a semiconductor integrated circuit device including a test element group circuit according to the present invention. Referring to FIG. 4, a semiconductor integrated circuit device 100 includes a first and second pads 110 and 120, internal circuits 130 and 140 each connected to the first and second pads 110 and 120, and a test element group circuit 150 connected between the first and second pads 110 and 120. The test element group circuit 150 includes a plurality of inverters 151–154 and fuses 155 and 156. One end of the fuse 155 is connected to the first pad 110, and one end of the fuse 156 is connected to the second pad 120. The inverters 151–154 are connected in series between the other ends of the fuses 155 and 156. Adjacent inverters are electrically connected to each other via corresponding signal lines. For example, adjacent inverters 151 and 152 are connected to each other via a signal line L10, and adjacent inverters 153 and 154 are connected to each other via a signal line L16. It is to be understood that the rest inverters (not shown) of the test element group circuit 150 are electrically connected via corresponding signal lines. In this embodiment, unlike a single-layer interconnection structure as shown in FIG. 3, each of the signal lines L10–L16 in FIG. 4 has a multi-layer interconnection structure.

In operation, at a wafer-level test mode, the first and second pads 110 and 120 are connected to corresponding probe needles or pins, respectively. And then, a signal applied to the first pad 110 is outputted to the second pad 120 via the test element group circuit 150. AC properties of the test element group circuit 150 can be understood by parsing signals from the second pad 120.

In FIG. 4, the fuses 155 and 156 of the test element group circuit are formed of one of a laser fuse and an electric fuse. The fuses 155 and 156 are cut off after an electric die sorting (hereinafter, referred to as "EDS") test is performed at a wafer level. This is to prevent the test element group circuit 150 from affecting a normal operation of a chip. The first and second pads 110 and 120 are bonding pads that are connected to leads of a lead frame of a package, respectively.

Figure 5:
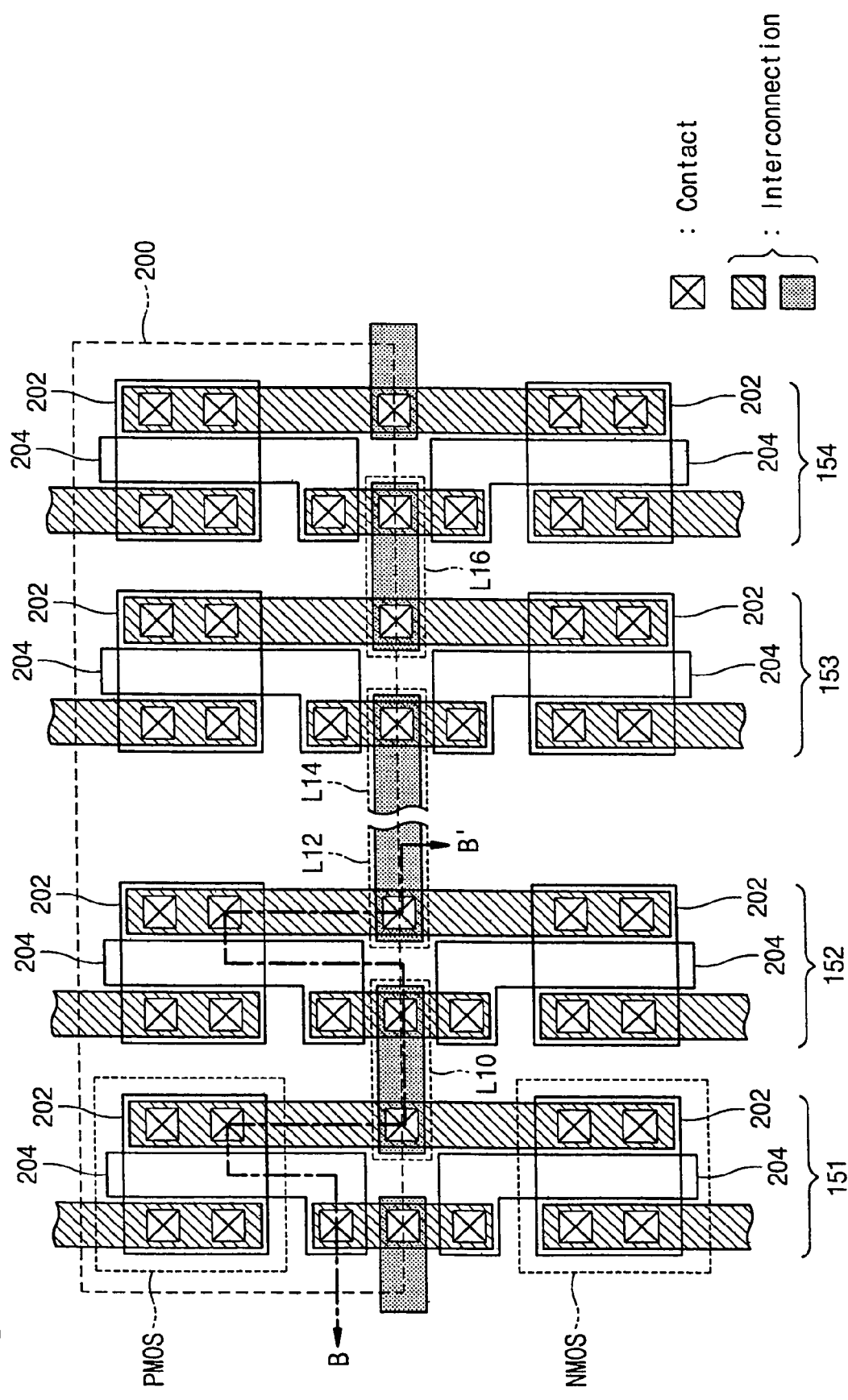
FIG. 5 is a top view of a test element group circuit in FIG. 4.
Figure 6:
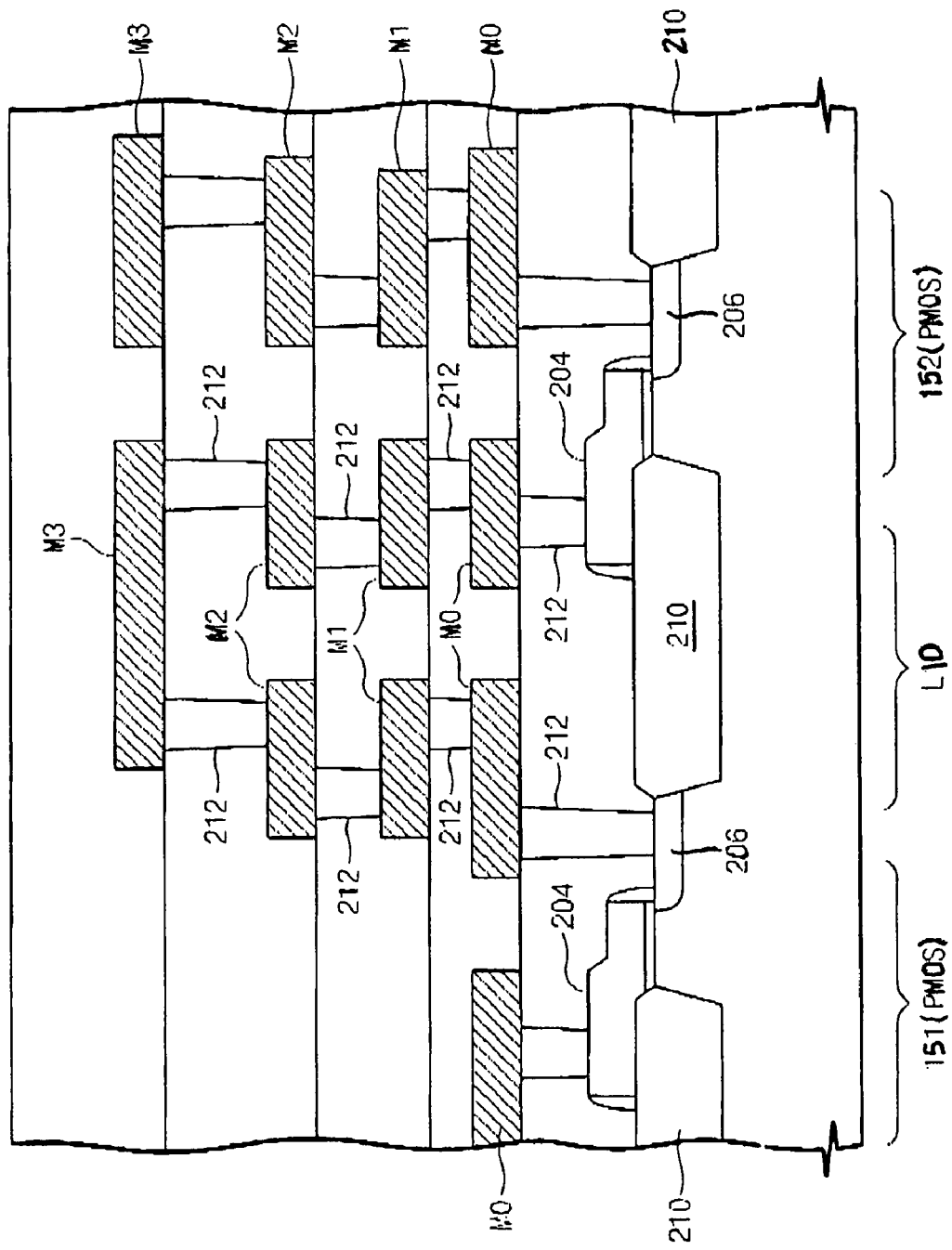
FIG. 6 is a cross-sectional view taken along a dotted line B–B' in FIG. 5.

FIG. 5 is a top view of a test element group circuit shown in FIG. 4, and FIG. 6 is a cross-sectional view of a test element group circuit taken along a dotted line B–B' of FIG. 5. Referring to FIG. 5, a reference numeral 200 indicates an N-well region formed on a semiconductor substrate (not shown), and a reference numeral 202 indicates an active region defined by device isolation (refer to FIG. 6, 210). A reference numeral 204 indicates a polysilicon gate. In FIG. 5, PMOS transistors of the inverters 151–154 are formed on the N-well region 200, and NMOS transistors of the inverters 151–154 are formed on the semiconductor substrate. A signal line (e.g., L10) that connects an output of the first inverter (e.g., 151) and an input of the second inverter (e.g., 152) is formed to have a multi-layer interconnection structure. This is further discussed below.

Assume that a semiconductor integrated circuit device according to the present invention has four interconnection layers. With this assumption, each of signal lines L10, L12, L14, and L16 according to the present invention is formed via all four interconnection layers. For instance, as illustrated in FIG. 6, a drain 206 of a PMOS transistor of an inverter 151 is electrically connected to a gate 204 of a PMOS transistor of an inverter 152. Interconnections M0, M1, M2, and M3 are formed at corresponding interconnection layers, respectively. The interconnections M0–M3 are electrically connected to each other via contact structures 212 as shown in the figure. As well known, a contact structure is formed by making a contact hole or via and filling it with a conductive material (e.g., polysilicon, tungsten, or aluminum).

For instance, the interconnection M0 and the drain of the PMOS transistor are electrically connected through a contact structure using polysilicon or tungsten. Interconnections (e.g., M0 and M1) are electrically connected to each other through a contact structure using tungsten or aluminum. Layers formed on a semiconductor substrate are electrically isolated by an interlayer insulation material (e.g., oxide). In this embodiment, the signal lines L10–L16 each having the contact structures 212 and the interconnections M0–M3 are formed to have the same pattern as illustrated in FIG. 6.

According to this embodiment of the present invention, in a case where AC properties are tested at a wafer level using a test element group circuit, it is possible to obtain electric properties of a MOS transistor as well as all process properties (e.g., processes of forming interconnections, contact structures, interlayer isolation, and so forth). Advantageously, all electric and process properties can be measured via the test element group circuit according to the present invention.

Figure 7:
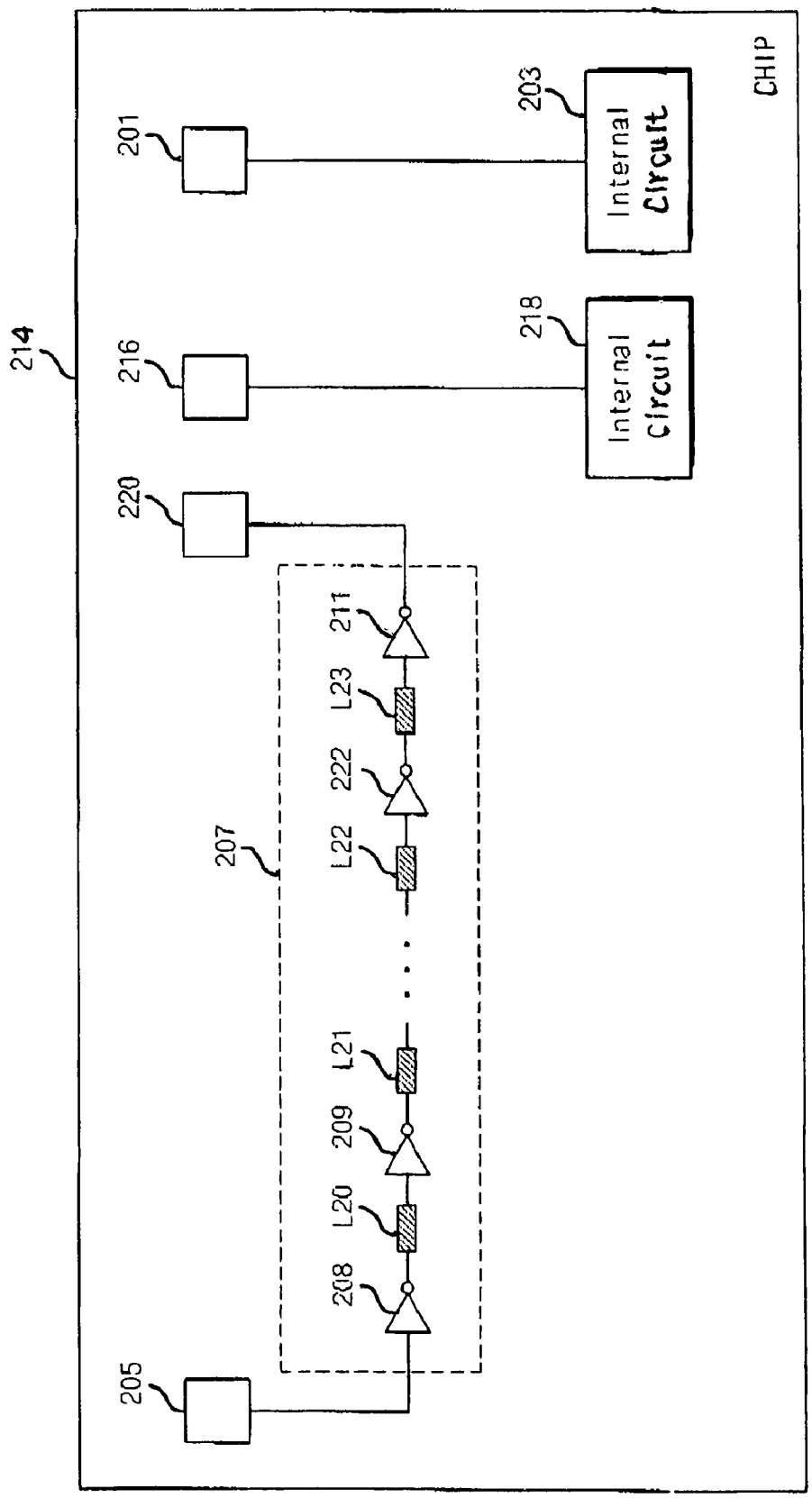
FIG. 7 is another preferred embodiment of a semiconductor integrated circuit device according to the present invention.

FIG. 7 is another preferred embodiment of the present invention. Referring to FIG. 7, a semiconductor integrated circuit device 214 of the present invention includes bonding pads 201 and 216, internal circuits 203 and 218 connected respectively to the bonding pads 201 and 216 test pads 205 and 220 as non-bonding pads, and a test element group circuit 207 connected between the test pads 205 and 220. The test element group circuit 207 comprises a plurality of inverters 208–209, 211, 222 connected in series between the test pads 205 and 220. In this embodiment, the test pads 205 and 220 are not connected to leads of a lead frame at a packaging level.

With the test element group circuit 207, adjacent inverters are electrically connected to each other via corresponding signal lines. For example, adjacent inverters 208 and 209 are electrically connected via a signal line L20, and adjacent inverters 222 and 211 are electrically connected through a signal line L23. It is to be understood that the remaining inverters (not shown) of the test element group circuit 207 are electrically connected through corresponding signal lines. Each of the signals lines L20–L23 in FIG. 7 has a multi-layer interconnection structure as illustrated in FIG. 6.

According to preferred embodiments of the present invention, signal lines that connect adjacent inverters are formed using all interconnection layers of a semiconductor integrated circuit device. However, it is to be understood that a part or at least two ones of interconnection layers are used for the signal lines. Alternatively, signal lines for connecting adjacent inverters of a test element group circuit are formed using all interconnection layers thereof. In addition, a part of signal lines for connecting adjacent inverters in a test element group circuit can be formed to have a multi-layer interconnection structure.

As set forth above, inverters constituting a test element group circuit are connected through signal lines that have a multi-layer interconnection structure, respectively. In the case of testing AC properties at a wafer level using the present test element group circuit according to the present invention, the AC properties can be measured considering all processes that are used to make a semiconductor integrated circuit device. By so doing, electric and process properties of the semiconductor intergrated circuit device can be measured through the test element group circuit according to preferred embodiments of the present invention. A circuit pattern can be designed with known process properties by measuring AC properties of each chip reflecting process properties. This facilitates better and quicker analysis. Further, problems after packaging can be minimized by measuring AC properties according to process properties of each chip. For example, in a case where a test result prior to assembling or packaging is not identical with that after assembling or packaging, it is capable of exactly analyzing whether troubles arise at a package level or a wafer level.

The invention has been described using exemplary preferred embodiments. However, it is to be understood that the scope of the invention is not limited to disclosed embodiments. On the contrary, it is intended to cover various modifications and similar arrangements. The scope of the claims, therefore, has to be accorded the broadest interpretation so as to encompass all such modifications and similar arrangements.

What is claimed is:

1. A semiconductor integrated circuit device comprising:
   a first pad and a second pad; and
   a test element group circuit connected between the first pad and the second pad to allow measuring of electrical characteristics of the semiconductor integrated circuit device;
   wherein the test element group circuit includes a plurality of inverters connected between the first pad and the second pad and at least two of the inverters are electrically connected to each other via a signal path formed by a multi-layer interconnection structure, wherein said multi-layer interconnection structure of said signal path is comprised of at least three interconnection layers.

2. The semiconductor integrated circuit device according to claim 1, wherein said multi-layer interconnection structure of said signal line comprises said at least three interconnection layers, at least one metal interconnection formed on each of the at least three interconnection layers and a plurality of contact structures, the metal interconnections are electrically connected to each other via the contact structures.

* * * * *